US010670440B2

(12) United States Patent
Tashiro et al.

(10) Patent No.: US 10,670,440 B2
(45) Date of Patent: *Jun. 2, 2020

(54) THERMAL AIRFLOW MEASURING DEVICE

(71) Applicant: Hitachi Automotive Systems, Ltd., Hitachinaka-shi, Ibaraki (JP)

(72) Inventors: Shinobu Tashiro, Hitachinaka (JP); Keiji Hanzawa, Hitachinaka (JP); Noboru Tokuyasu, Hitachinaka (JP); Takeshi Morino, Hitachinaka (JP); Ryosuke Doi, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 97 days.

This patent is subject to a terminal disclaimer.

(21) Appl. No.: 15/971,078

(22) Filed: May 4, 2018

(65) Prior Publication Data

US 2018/0252564 A1 Sep. 6, 2018

Related U.S. Application Data

(63) Continuation of application No. 14/376,047, filed as application No. PCT/JP2013/051023 on Jan. 21, 2013, now Pat. No. 9,989,390.

(30) Foreign Application Priority Data

Feb. 21, 2012 (JP) .................................. 2012-34627

(51) Int. Cl.
*G01F 1/692* (2006.01)
*G01F 1/684* (2006.01)
*F02D 41/18* (2006.01)

(52) U.S. Cl.
CPC ........... *G01F 1/692* (2013.01); *F02D 41/182* (2013.01); *G01F 1/6842* (2013.01);
(Continued)

(58) Field of Classification Search
CPC ....... G01F 1/692; G01F 1/6842; G01F 1/6845
(Continued)

(56) References Cited

U.S. PATENT DOCUMENTS 6,516,785 B1 2/2003 Nakada et al.
2002/0023486 A1 2/2002 Watanabe et al.
(Continued)

FOREIGN PATENT DOCUMENTS

JP 59-189117 U 12/1984
JP 4-70519 A 3/1992
(Continued)

OTHER PUBLICATIONS

International Search Report (PCT/ISA/210) dated Apr. 2, 2013 with English translation (five pages).
(Continued)

*Primary Examiner* — John Fitzgerald
*Assistant Examiner* — Rodney T Frank
(74) *Attorney, Agent, or Firm* — Crowell & Moring LLP

(57) ABSTRACT

In order to provide a flow measuring device high in thermal responsiveness, the flow measuring device includes a temperature detecting element 2 for temperature detection, and a conductive metal lead frame 3 that supports and fixes the temperature detecting element. Of the metal lead frame, a part of the metal lead frame mounted with the temperature detecting element has a portion which is thinner than the thickness of the other metal lead frame or narrower than the width of the other metal lead frame.

8 Claims, 4 Drawing Sheets

(52) U.S. Cl.
CPC .. *G01F 1/6845* (2013.01); *H01L 2224/48137* (2013.01); *H01L 2224/48247* (2013.01); *H01L 2924/1815* (2013.01)

(58) Field of Classification Search
USPC .................................................. 73/204.26
See application file for complete search history.

(56) References Cited

U.S. PATENT DOCUMENTS

| | | | |
|---|---|---|---|
| 2002/0187318 A1* | 12/2002 | Yamashita | H01L 23/3737 428/209 |
| 2003/0090883 A1* | 5/2003 | Asahi | H01L 21/6835 361/761 |
| 2004/0055377 A1 | 3/2004 | Kikuchi et al. | |
| 2009/0103276 A1* | 4/2009 | Sakamoto | H05K 1/144 361/792 |
| 2009/0135572 A1* | 5/2009 | Takakusaki | H01L 25/162 361/803 |
| 2010/0072604 A1* | 3/2010 | Komatsu | H01L 23/481 257/691 |
| 2010/0090332 A1* | 4/2010 | Kim | H01C 1/028 257/692 |
| 2010/0123240 A1 | 5/2010 | Sato et al. | |
| 2010/0212433 A1 | 8/2010 | Hunziker et al. | |
| 2011/0127694 A1* | 6/2011 | Kurita | B29C 39/006 264/272.13 |
| 2011/0140211 A1* | 6/2011 | Kono | G01F 1/684 257/415 |
| 2011/0272768 A1 | 11/2011 | Nakamura et al. | |

FOREIGN PATENT DOCUMENTS

| | | |
|---|---|---|
| JP | 7-234142 A | 9/1995 |
| JP | 11-6752 A | 1/1999 |
| JP | 2001-153701 A | 6/2001 |
| JP | 2001-311637 A | 11/2001 |
| JP | 2004-37302 A | 2/2004 |
| JP | 2008-292508 A | 12/2008 |
| JP | 2009-58230 A | 3/2009 |
| JP | 2010-112804 A | 5/2010 |
| JP | 2011-119500 A | 6/2011 |

OTHER PUBLICATIONS

Machine translation of JP 11-006752, Jan. 12, 1999, provided by Applicants.

Japanese-language Office Action issued in counterpart Japanese Application No. 2017-198990 dated Jun. 19, 2018 with English translation (eight (8) pages).

* cited by examiner

ENLARGED PORTION A

ENLARGED PORTION A

THERMAL AIRFLOW MEASURING DEVICE

TECHNICAL FIELD

The present invention relates to a thermal airflow measuring device for measuring the flow rate of air flowing through an intake air passage of an internal combustion engine.

BACKGROUND ART

One of the most common methods of accurately controlling an air-fuel ratio of an internal combustion engine is means for measuring an intake air flow rate and an intake air temperature to sequentially calculate a fuel injection amount at which a combustion status is optimal. A thermal flow measuring device is equipped with a flow rate detection unit including a heating resistor, a temperature detection unit including a thermistor, and an electronic control circuit unit that controls the heating temperature of the flow rate detection unit. A known conventional flow measuring device has a thermistor element for temperature measurement disposed in an intake pipe of an internal combustion engine to allow it to be hardly affected by heat from the internal combustion engine in order to thereby achieve a cooling effect by intake air.

A structure with such a technique applied to includes a flow measuring device described in Patent Document 1.

RELATED ART LITERATURE

Patent Document

Patent Document 1: JP-2008-292508-A

SUMMARY OF THE INVENTION

Problems to be Solved by the Invention

The challenge lies in ensuring high detection temperature accuracy of a temperature detecting element and thermal response thereof. This is ascribable to the material and structure of the conventional temperature detecting element. A conductive member is used for conductive lead wires bonded to both ends of a temperature detecting chip, and conductive terminals or connector terminals supporting the temperature detecting element having lead wires. A conductive metal material has higher thermal conductivity rate by one digit or more as compared to, for example, a resin, and the heat of a resin housing of a flow measuring device body is transferred to the temperature detecting chip through a metal material, which causes certain amount of errors. Specifically, the heat is conducted through the metal terminal from the housing to the temperature of the temperature detecting chip portion exposed to air and the housing body via a coating film when the material is used in a steady operation. This temperature is in equilibrium to an actual temperature to be measured. Further, in a transient period when the temperature of the body housing and the intake air temperature at the startup of an internal combustion engine are different mainly, heat sink is slow if the heat capacity of each of the lead wire, terminal, and coating film is large, which deteriorates the detection thermal response of the temperature detecting chip.

An object of the present invention is to provide a flow measuring device high in thermal response.

Means for Solving the Problems

In order to achieve the above object, a thermal airflow measuring device of the present invention is constructed as follows.

The thermal airflow measuring device includes a temperature detecting element for temperature detection, and a conductive metal lead frame for supporting and fixing the temperature detecting element. A part of the metal lead frame on which the temperature sensing element is mounted has a portion thinner than the thickness of the other metal lead frame or narrower than the width of the other metal lead frame.

Effect of the Invention

The present invention makes it possible to provide a flow measuring device high in thermal response.

MODE FOR CARRYING OUT THE INVENTION

Hereinafter, embodiments of the present invention will be described with reference to the drawings.

Embodiment 1

A sensor chip package 1 according to one embodiment of the present invention will first be described with FIGS. 1 to 3.

Figure 1:
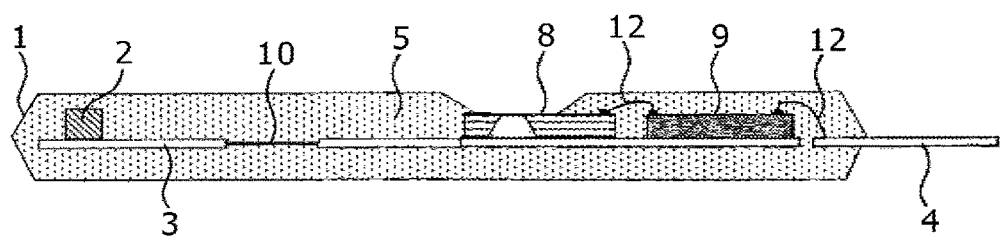
FIG. 1 is a schematic cross-sectional view of a sensor chip package.
Figure 2:
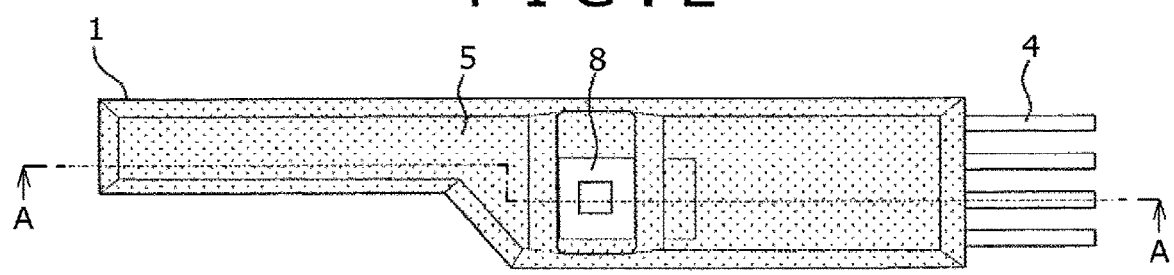
FIG. 2 is a top view of the sensor chip package shown in FIG. 1.
Figure 3:
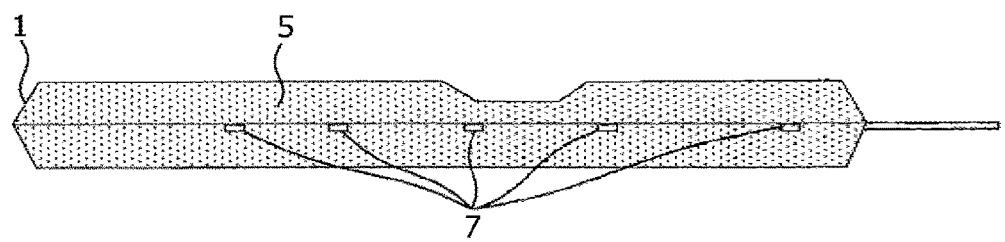
FIG. 3 is a side view of the sensor chip package shown in FIG. 1.

In FIGS. 1 to 3, a thermistor chip 2 for detecting the temperature, a flow rate sensor chip 8 and a control circuit chip 9 for detecting an air flow rate, and a lead frame 3 for supporting and fixing them to achieve an electrical conduction are implemented by way of soldering or a conductive adhesive. All the chips needed are joined by heating and curing through the single step at earliest.

When the electrical conduction is not necessary between the back surface of the chip and each lead frame 3, an insulative, e.g., epoxy adhesive can also be used for the flow rate sensor chip 8 and the control circuit chip 9 without the conductive adhesive.

Conductive metal materials such as a copper alloy, an iron-nickel alloy, and stainless steel are used for the lead frame 3. The lead frame 3 is formed by precision micro press molding or etching.

After the mounting of the thermistor chip 2, the flow rate sensor chip 8, and the control circuit chip 9 to the lead frame 3, each sensor chip and the control circuit chip 9 are joined to each other with the use of thin wires 12 such as gold, copper, and aluminum wires to achieve mutual electrical conduction and wire-bonding them by a method such as thermocompression, ultrasonic vibrations, and ultrasonic thermocompression.

The lead frame 3 mounted with the thermistor chip 2, the flow rate sensor chip 8, and the control circuit chip 9 is covered by a transfer molding with the use of a thermosetting resin 5 in such a manner as to include them. A portion (called outer leads 4) of the lead frame 3 required to achieve electrical conduction with the partial surface of the flow rate sensor chip 8 and the outside is transfer-molded so as to be exposed from the resin 5.

Figure 4:
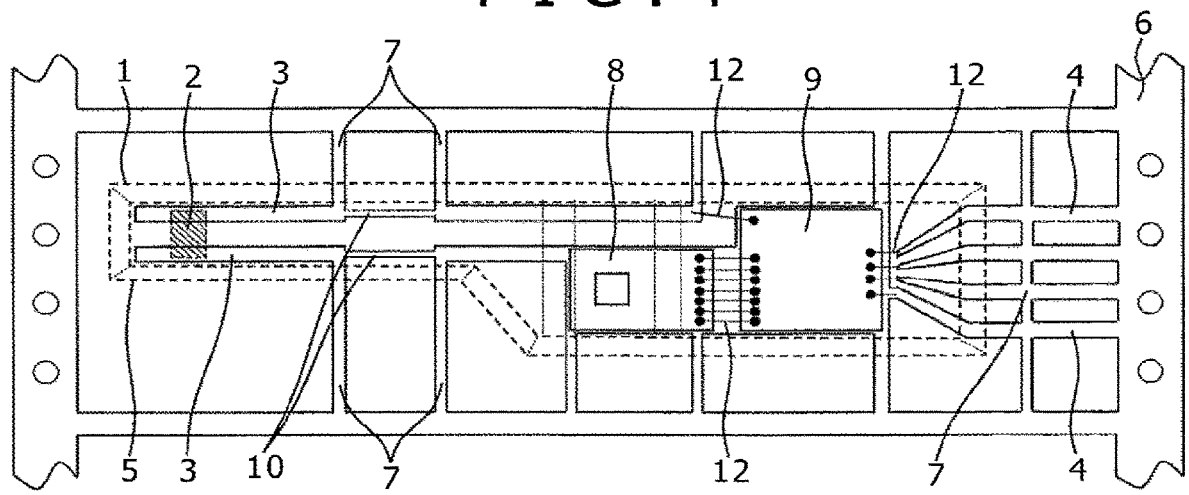
FIG. 4 is a schematic structural view of lead frames and outer leads.

The sensor chip package 1, the lead frame 3, and the outer lead 4 will now be described in detail with the use of FIG. 4. The portion of the resin 5, which is thermally cured by the transfer molding, is shown in a broken line.

The lead frame 3 is preferably placed such that the side opposite to one end to which the thermistor chip 2 is mounted is out of the surface that is to be resin-molded. The lead frame 3 is configured to connect with an outer frame 6. The lead frame 3 can be seen to divide its role into; (1) a portion finally configured as a part of a product; and (2) a suspended structural portion required for manufacture, for connecting with the outer frame 6. In particular, the suspended structural portion of the latter is called a tie bar 7.

The tie bar 7 is a part punched by the same press as the lead frame 3 or others. The tie bar 7 plays the role of maintaining a shape in such a manner that when the electrical circuit is configured in the manufacturing process, the lead frame 3 does not come apart even if disconnected at required places. Then, after the transfer molding has been completed with the use of the thermoplastic resin 5, the portion of the tie bar 7 is cut off following the lead frame 3 fixed by the resin so that the cut portions do not remain in the product other than the cut cross-sections.

The outer leads 4 for withdrawing a detection signal of each sensor chip to the outside are also similarly connected to the outer frame 6 via the tie bar 7, whereby the shape of each outer lead is maintained.

The lead frame 3 mounted with the thermistor chip 2 is formed by a precise and fine pressing or an etching to a part of signal lines of positive and negative electrodes. The dimension of the lead frame 3 is consequently configured to be thinner than the board thickness, narrower than the lead width, or both thinner and narrower.

An electric signal of the thermistor chip 2 is connected to the control circuit chip 9 by way of the thin wire such as the gold or copper wire through the lead frame 3, or is connected directly to the outer leads 4 aside from the function of flow rate detection, followed by being output to an external device.

The lead frame 3 mounted with the thermistor chip 2, the flow rate sensor chip 8, and the control circuit chip 9, and the thin wires 11 and 12 having less heat capacity, such as a gold, copper, and aluminum wire are provided with a package structure covered with and protected by the resin 5 with a method like transfer molding, except for a part of the surface of the flow rate sensor chip 8.

After the resin molding has been completed, the tie bar 7, which extends out to the outer periphery of the sensor chip package 1, is cut off, and the disconnected surface is sealed with an adhesive as needed, thus resulting in the sensor chip package 1.

The need for temperature measurement in an internal combustion engine and the structure of the temperature detecting element 2 will be described here. The temperature measurement is also used for the optimum control of the fuel injection amount according to fuel consumption in a transient period such as during a cold start, and suppression of harmful substances in exhaust gas by catalyst temperature control in addition to the application aiming at a restraint on the internal combustion engine in a steady state. A temperature detecting function for measuring the temperature of air sucked by the internal combustion engine is essential. Therefore, a temperature detecting element 2 based on various schemes and structures has been proposed and practically used widely today. A few of the known temperature detecting element 2 are a temperature measuring resistor including a thermocouple, a diode, and platinum, and an element formed with a temperature sensitive resistor on a silicon substrate using a semiconductor micromachining technology. One of the methods of the technology is to detect the temperature from the resistance value of a thermistor where the thermistor is adopted as a detecting element. This thermistor employed for the temperature detecting element is configured as follows: a thermistor element having a thermistor chip protected with various structures is placed in a flow path through which air in the internal combustion engine flows; and the thermistor element is thereby electrically connected to the circuit in the flow measuring device or to a connector terminal for a conduction to a fuel injection amount calculation unit (engine control unit). The temperature detecting element has been practical in these ways.

The thermistor element is bonded with lead wires such as a dumet wire having its adhesion to the soft glass improved by bonding copper to a conductive nickel alloy, a CP line (kappa-ply line) thick-plated by copper with iron or steel as a core material in order to achieve an electrical conduction with an external device across the thermistor chip, applying machining for diffusion bonding of a metal-to-metal interface by press bonding, and generating copper suboxide on the outermost surface. A cylindrical glass tube is covered to enclose the entire circumference of the chips and the junction between the chips and the lead wires. The chip, lead wires, and glass are calcined to thereby fuse and contract the glass, so that the chip and the lead wires are stabilized. Alternatively, there is a structure where a glass tube is not used; a temperature detecting element with its junction to the chip and the lead wires protected by coating-fixing of a thermosetting resin after the chip and the lead wires are bonded by solder or other materials. It has been known that in the case of the dumet wire, there is obtained a closer adhering structure by calcining the glass to melt the glass and by chemically bonding the glass and cuprous oxide. Then, in order to place and support and fix the completed thermistor element in the flow path of the internal combustion engine, each of the element's lead wires is joined by welding or other methods to a conductive sheet metal-made terminal. For the purpose of the transfer of an electrical signal to and from an external device, each conductive terminal is connected directly or indirectly to a connector terminal through a separate conductive member such as an aluminum wire and an electronic circuit board. The connector terminal is molded integrally with an insulative housing body such as a resin to support and fix it. The thermistor element electrically connected via the conductive terminals disposed in the housing body is also connected to the flow measuring device or the fuel injection amount calculating device (engine control unit) through a connector disposed in the housing. In general, a constant voltage is supplied to the thermistor element with the use of the corresponding connector terminal through at least one series resistor from the above device. When an inter-terminal voltage of the thermistor element, divided by the series resistor, is detected, the resistance value changes with the temperature change of the thermistor element, whereby a detection voltage changes as well. It is thus possible to obtain the voltage change as a temperature signal.

There are many cases in which the flow measuring device is used in a relatively harsh environment in an internal combustion engine such as an automobile. For example, the flow measuring device is used under harsh environments including corrosive gases generated under a fuel vapor atmosphere and high temperature environments, and water and salt water scattering through an air cleaner filter. One of the temperature detecting elements based on an assumption to be exposed to the flow path of the internal combustion engine is a glass-sealed thermistor element serving as the temperature detecting element especially ensures reliability by the followings methods: coating the interface (small gap) between the lead wires and the glass with the use of a resin with a thermosetting property to prevent corrosion and electrolytic corrosion generated in the interface; sealing the junction between each lead wire and the conductive terminal with a thermosetting resin after soldering or welding, depending on the degree of additionally required durability; and using heat-resistant coated wires to prevent electrochemical corrosion developed between the lead wires having different polarity to thereby inhibit and protect short circuit defects due to water or salt water between the lead wires. Since, however, the glass tube is placed so as to cover the thermistor chip itself and the junction between the thermistor chip and each lead wire, there is a limit to structural corrosion resistance with respect to an area larger than the diameter of the lead wire. A thermistor element, generally called an axial lead type and having lead wires on substantially the same straight line in the axial direction in terms of the positive and negative electrodes, encounters a difficulty in uniformizing a coating thickness of a glass tube end (fillet portion) caused due to the difference between the diameter of each lead wire and that of the glass tube. There is thus a case where the thickness of the fillet portion cannot be ensured enough or corrosion is caused when the coating film is in a porous state, i.e., is formed with pores in the film. On the other hand, in a temperature detecting element generally called a radial type and having two lead wires disposed in parallel in the same direction, a coating film is required since a short circuit between the lead wires occurs in a bare state of a dumet wire even if the adhesion to the soft glass is increased with the use of the dumet wire to prevent micro crevice corrosion in the interface between each lead wire and the glass. The distance between the lead wires, however, is short as it depends on the size of the thermistor chip. It is thus difficult to form a coating film having no gap between the lead wires. Further, in the case that requires processing (forming) of extending the lead wire in the following step, there is a concern that damage can be given to the coating film applied around the lead wires. When a heat-resistance coated wire is used instead of the dumet wire, it is difficult to take complete countermeasures against the corrosion occurring in the small gap in the interface between the coated wire and the glass tube.

In the configuration described in the present embodiment 1, since the entire periphery of the thermistor chip 2 and the lead frame 3 can be covered with the thin resin, it is possible to avoid the non-uniformity of the coating thickness of the glass tube end caused by the difference between the diameter of each lead wire and the diameter of the glass tube. The cracks caused by strains such as heat and vibrations applied to the fillet portion can be averted as well, in comparison with the structure in which the thermistor chip 2 is held with the glass tube and the junction between the glass tube and each lead wire is covered with a coating film. It therefore is possible to improve the corrosion resistance.

The temperature detecting element also needs to take heat into consideration in addition to the corrosion resistance. The problem specifically is an error between the temperature of the temperature detecting unit with the temperature detecting element mounted thereto and the actual temperature in the flow path of the internal combustion engine. The error could occur under the environments where: the flow path wall is higher in air temperature than within the flow path due to receiving radiant heat from the internal combustion engine; and the flow path wall is at room temperature or under the low temperature environment at the time of startup, yet the temperature in the flow path is high. In order to minimize the temperature detection error even in any of the foregoing, the thermistor element has a structure actively subjected to the air. The lead wires and the conductive terminals are further exposed to the air (heat release), thereby to reduce an effect by the temperature difference between the flow path wall and the installation part material of the temperature detecting element. Another method for fewer temperature errors includes reducing the cross-sectional area of the member in order to suppress the heat transfer. It is however necessary for the flow measuring device or the temperature detecting element to be designed to withstand variations and a temperature and humidity cycle in addition to the corrosion resistance, considering the installation environment of the flow measuring device or the temperature detecting element. Therefore, the temperature detecting element includes a lead wire with dimensions of approximately 0.2 mm or more. Columnar and prismatic support terminals for supporting and fixing the detecting element also have larger dimensions than the one above. The temperature detecting element is inevitable from having a complex structure since another reinforcing means is structurally required to narrow the wire diameter or the cross-sectional dimensions.

However, in the structure described in the present embodiment 1, it is possible to cover the whole circumferences of the thermistor chip 2 and the lead frame 3 with the resin. It is therefore possible to thinly form a portion of the lead frame serving as the electrical signal line of the same potential, which cannot be achieved because of insufficient mechanical strength in the glass tube, the junction between the glass tube and each lead wire, and further the structure of coating (to cover) and protecting the lead wire itself. Therefore, a decline in the cross-sectional area of the lead frame 3 curbs the conduction of the highest heat conveyed from the outer leads 4 (metal) made of the intended conductive material. This leads to provision of a thermal isolating structure portion 10, which is capable of isolating the temperature detected by the thermistor chip 2 from the heat of the body supporting the sensor chip package 1 and incorporating the same.

Thus, since the effects of heat conducted from the outside (internal combustion engine) through the outer leads 4 and the housing 14 are relaxed by the thermal isolating structure portion 10, the detection function of the thermistor chip 2 is high in precision with less thermal effects and better thermal response, thereby making it possible to realize a flow measuring device having high reliability.

Embodiment 2

Embodiment 2 which is an embodiment in the present invention will now be described below.

FIGS. 5 through 8 sequentially correspond to the illustrated directions shown in FIGS. 1 through 4, respectively, and show an example in which the method of the thermal isolating structure portion 10 previously mentioned can be achieved by another means with respect to FIGS. 1 through 4.

Figure 5:
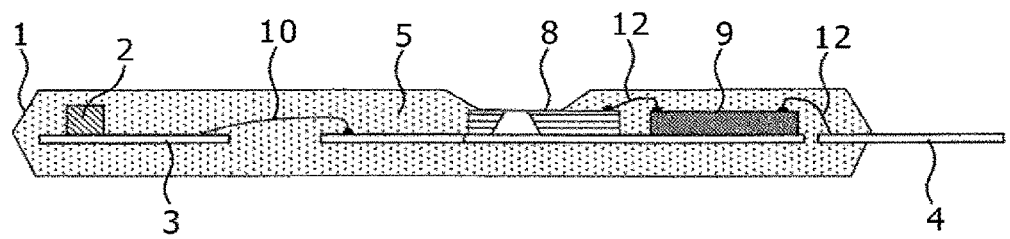
FIG. 5 is a schematic cross-sectional view of a sensor chip package.
Figure 6:
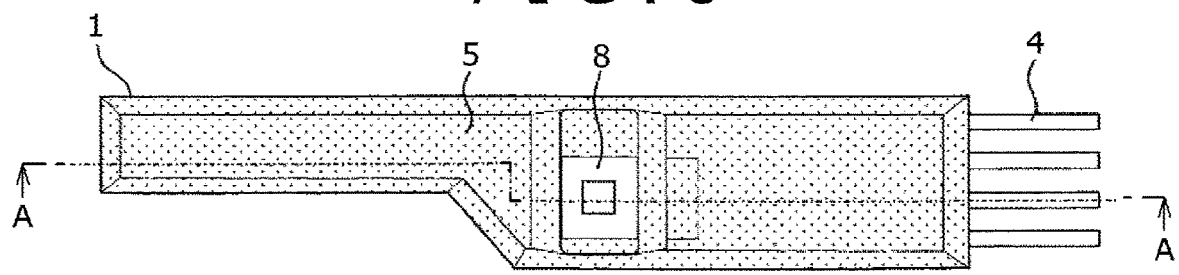
FIG. 6 is a top view of the sensor chip package shown in FIG. 1.
Figure 7:
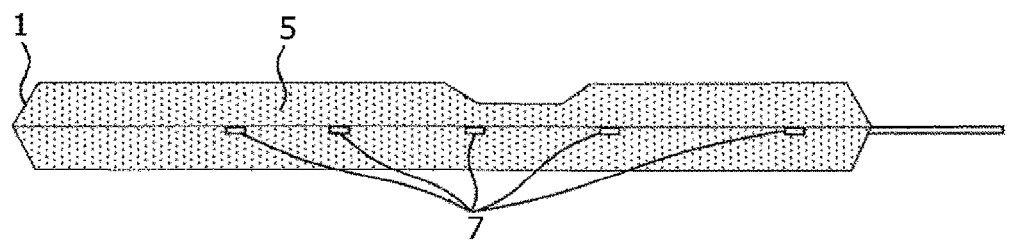
FIG. 7 is a side view of the sensor chip package shown in FIG. 1.
Figure 8:
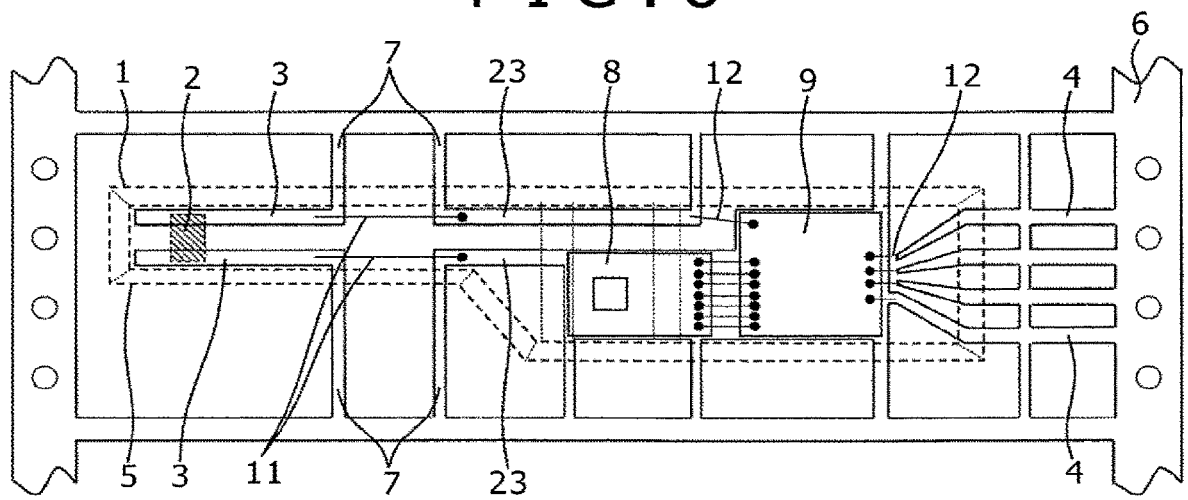
FIG. 8 is a schematic structural view of lead frames and outer leads.

In FIG. 5, a lead frame 3 is formed by press molding or etching in such a manner as to divide the middle of the positive and negative electrode signal lines provided between the thermistor chip 2 and the control circuit chip 9. The lead frame 3 mounted with the thermistor chip 2 is still in an electrically disconnected state at this time. In order to configure the electrical signal lines of the same polarity, the two lead frames 3 and 23 are subjected to wire-bonding-joint therebetween by thermocompression bonding, ultrasonic vibrations, or ultrasonic thermocompression bonding with the use of thin wires 11 low in heat capacity such as a gold wire, a copper wire, and an aluminum wire. The lead frame 23 having achieved the electrical conduction by way of being connected to the lead frame 3 mounted with the thermistor chip 2 and to the thin wires 11 has a package structure covered with and protected by the resin 5 by way of the method including the transfer molding in such a manner to incorporate all the necessary chip components and gold wires. After the resin molding has been completed, a tie bar 7 protruding to the outer periphery of the sensor chip package 1 is cut off. The cut surface of the tie bar 7 is sealed with a resin or adhesive and turns out to be the sensor chip package 1.

Thus, it is possible to completely separate the part of the lead frame 3 corresponding to the electrical signal lines of the same potential, which cannot be achieved in the glass tube, the junction between the glass tube and the lead wire, and further the structure of coating and protecting the lead wires. The divided lead frame 3 and lead frame 23 can be configured without impairing the function as an electrical circuit by being connected to the thin wires 11 having lower heat capacity than the lead wires. It is possible to block the heat conducted through the lead frame 23 and the outer leads 4 due to the radiant heat of an intended internal combustion engine by a resin having higher thermal resistance than a metal member. It is further possible to obtain more advantages of a thermal isolating structure that separates the temperature detected by the thermistor chip 2 from heat of the body supporting the temperature detecting unit and incorporating the same.

Embodiment 3

An embodiment 3 that is an embodiment of the present invention will now be described below.

Figure 9:
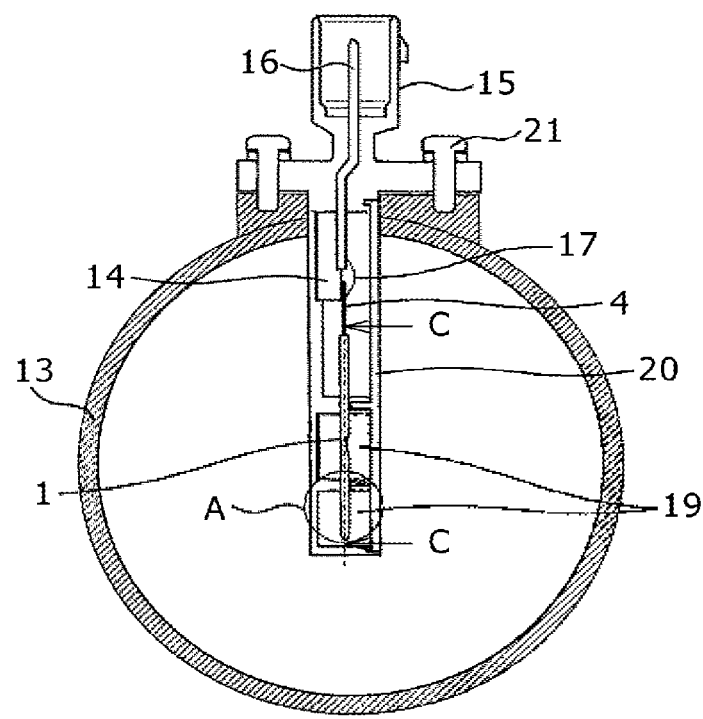
FIG. 9 is a schematic structural cross-sectional view of an air flow rate and a temperature measuring device.
Figure 10:
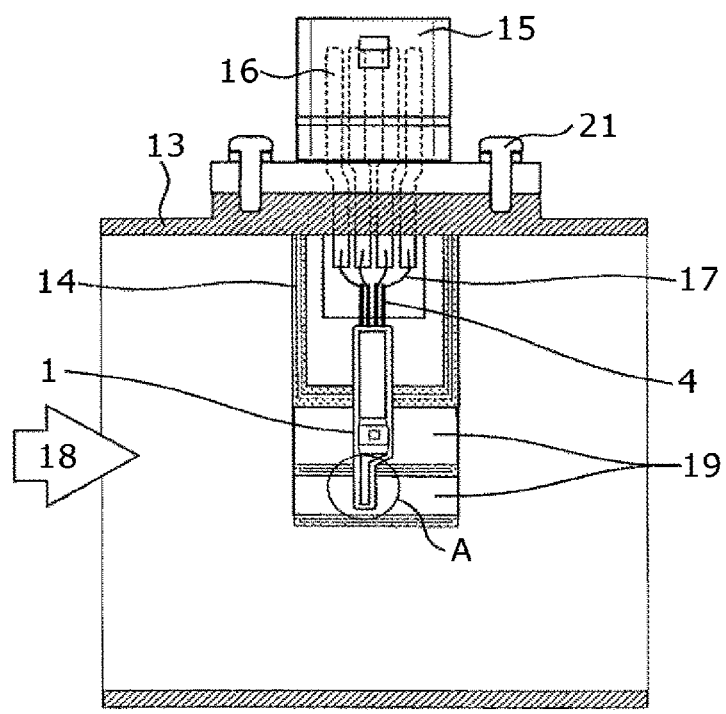
FIG. 10 is a schematic side cross-sectional view of the air flow rate and temperature measuring device shown in FIG. 9.

FIG. 9 is a schematic structural cross-sectional view of an air temperature measuring device being in a state where the sensor chip package 1 described in the embodiments 1 and 2 is attached to an intake pipe (duct) 13 for introducing air 18 to be taken in an internal combustion engine. FIG. 10 is a schematic structural cross-sectional view as seen from the side of FIG. 9.

In FIGS. 9 and 10, the sensor chip package 1 is bonded to and built in a body of a resin-made housing 14 that serves as a box-shaped insulating housing with the use of an adhesive, for example.

The housing 14 is provided with a function to surround the bottom and side faces of the sensor chip package 1 substantially over its entire circumference as a case member for housing the sensor chip package 1 in order to protect it. The housing 14 also has a connector (coupler) 15 for transmitting and receiving electrical signals to and from an external device, the connector being formed, for example, by resin molding. Conductive connector terminals 16 made of a copper alloy or other materials are insert-molded in the connector 15 with the use of a thermoplastic resin.

The case member may be constituted by bonding and fixing a plate-like resin or sheet-metal-made base plate to the bottom face of the housing 14 as a separate member or by insert-molding the plate in the housing 14 so as to be integrated.

The sensor chip package 1 mounted to the housing 14 is welded to each of the connector terminals 16 by ultrasonic vibrations with the use of an aluminum thin wire 17 or other materials to set up an electric interface with an external device.

The electrical conduction can be achieved even by bending (forming processing) each of the outer leads 4 of the sensor chip package 1 by press processing and joining it directly to the connector terminal 16 with the use of a method such as spot welding, ultrasonic vibration welding, and laser welding.

In a method of nipping the plate-like terminal surface and each lead by welding electrodes when welding and joining each of the connector terminals 16 and the outer lead 4 and performing welding from the front and back directions of the terminal surface, the bottom face of the housing 14 could block the method, whereby the welding electrodes might fail to be disposed. Therefore, a space in which all of the bottom face of the housing 14 or the welding electrodes can be inserted should be opened in order that the connector terminals 16 and the outer leads 4 may be welded. After they have been bonded, the base plate can be established as a structure even by being jointed to the housing 14.

The housing 14 may have a structure in which subpassages 19 that take in a part of the air 18 passing through the intake pipe 13 is formed by resin molding and the sensor chip package 1 is protected from damage such as drop impact.

The housing 14 having mounted the sensor chip package 1 therein is sealed with a plate-like resin-made cover 20 with the use of an adhesive or joined to the housing 14 by way of a method such as laser welding, vibration welding, and ultrasonic welding.

The housing 14 sealed with the cover 20 is fixed with the use of screws 21 or a method such as thermal welding in such a manner as to be located inside the intake pipe 13 through which the air 18 introduced into the internal combustion engine flows.

The connector 15 integrated with the housing 14 is fixed to be located outside of the intake pipe 13.

Figure 11:
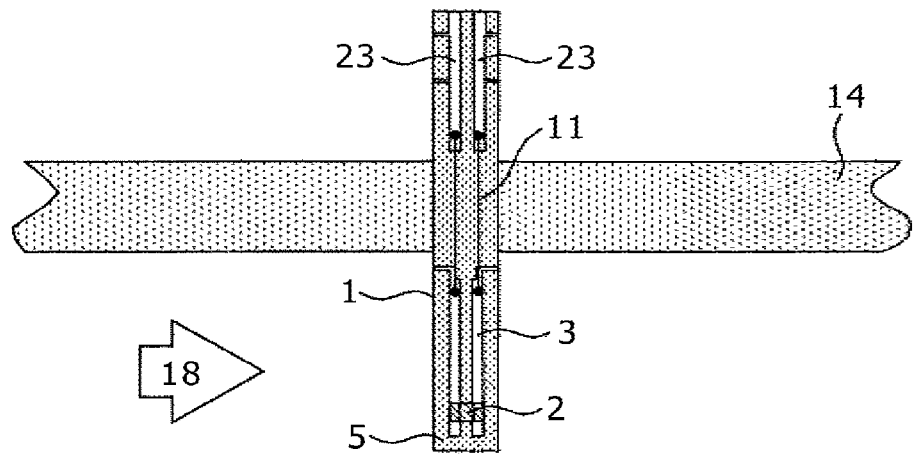
FIG. 11 is an enlarged sectional view taken along line C-C of a portion A of FIG. 10.

FIG. 11 is an enlarged sectional view taken along line C-C of a portion A shown in FIGS. 9 and 10. In the sensor chip package 1 mounted to the housing 14, preferably, the thermal isolating structure portion 10 provided in the lead frame 3 mounted with the thermistor chip 2 is arranged such that the thermistor chip 2 and the lead frame 3 are exposed to the tip side of the housing as viewed in the direction opposite to the connector 15 with the resin portion of the body of the housing 14 as a boundary, and is disposed inside the housing resin 5. The lead frame 23 located on the side opposite to the lead frame 3 equipped with the thermistor chip 2 with the thermal isolating structure portion 10 as a boundary is preferably placed in the direction on the side of a circuit chamber whose four sides are surrounded by the resin of the housing 14 body. Alternatively, the thermal conduction of the metal member can be reduced even if a part of the thermal isolating structure portion 10 is inside the range of the resin portion of the housing 14 as long as the following condition is met; the signal lines of the lead frame 3 having electrically same polarity is structured to be a reduced cross-section surface, or to be including a thin wire low in heat capacity, i.e., to be thermally-separated.

As a result, the temperature detected by the thermistor chip 2 and the heat of the body for supporting and fixing the temperature detecting unit can be isolated. It is therefore possible to provide a flow measuring device having high temperature accuracy of air that the internal combustion engine sucks, as well as high thermal response.

Embodiment 4

Embodiment 4 which is an embodiment in the present invention will now be described below.

Figure 12:
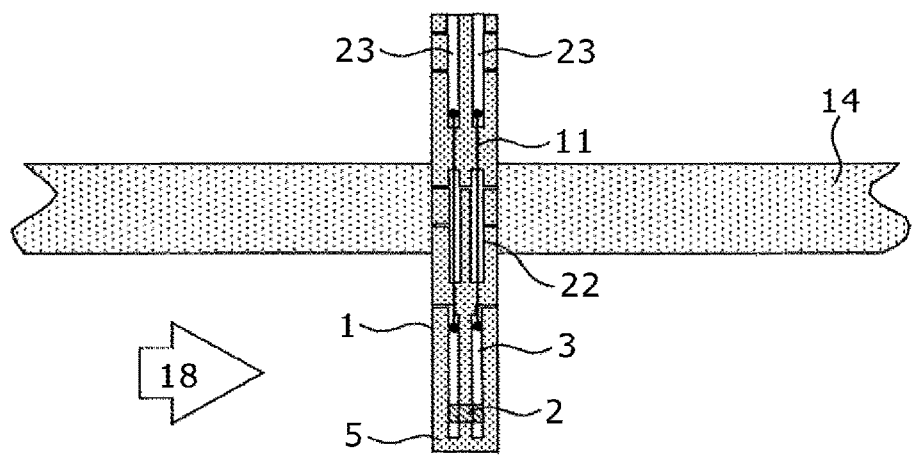
FIG. 12 is an enlarged sectional view taken along line C-C of the portion A of FIG. 10.

FIG. 12 shows a schematic cross-sectional view of the flow measuring device of FIG. 11 to which further improvements have been added.

Lead frames 22 each electrically disconnected between a lead frame 3 mounted with a thermistor chip 2 and another lead frame 23 arranged in such a manner as to form an electrical signal line of the same polarity and connected to a thin wire 11 are created by precision fine press work or etching simultaneously with an outer frame 6 (lead frame body) through a tie bar 7. The lead frame 3 and the lead frame 23 divided after the thermistor chip 2 has been mounted on the lead frame 3 are bonded to each other by the thin wire 11 and transfer-molded with the use of a resin 5.

As a result, compared with the case where the part of the thermal isolating structure portion 10 provided in the lead frame 3 mounted with the thermistor chip 2 has stiffness with only the resin 5 as the structure, it is possible to further improve mechanical shock resistance and vibration resistance because the metal material lead frames 22 are contained inside the resin 5 and to isolate the heat conducted through the initially-targeted metal material, which thereby realizes the flow measuring device high in reliability.

REFERENCE NUMERALS 1 sensor chip package
2 thermistor chip (temperature detecting element)
3, 22, 23 lead frames
4 outer lead
5 resin
6 outer frame (lead frame body)
7 tie bar (lead frame suspension structure)
8 flow rate sensor chip
9 control circuit chip
10 thermal isolating structure portion
11, 12 thin wires
13 intake pipe
14 housing
15 connector (coupler)
16 connector terminal
17 aluminum thin wire
18 air (flow of air)
19 sub-passage (temperature sensor protecting member)
20 cover
21 screw

The invention claimed is:

1. A sensor chip package, comprising:
a temperature detecting element;
a first conductive lead frame extending between the temperature detecting element and a thermal isolating structure portion of the device;
a second conductive lead frame electrically interconnected with but physically separated by the thermal isolating structure portion from the first conductive lead frame;
a circuit chip electrically connected to the temperature detecting element and to outer leads, the temperature detecting element, the first conductive lead frame, the second conductive lead frame, the thermal isolating portion, and the circuit chip being sealed by a thermosetting resin; and
a physical quantity sensor element electrically connected to the circuit chip,
wherein the temperature detecting element is in contact with the first conductive lead frame, the thermal isolating structure portion is defined by thin wire having heat capacity below that of the first conductive lead frame, and the thin wire has smaller cross-sectional area than the first lead frame and the second lead frame.

2. The sensor chip package of claim 1, wherein the temperature detecting element is a thermistor chip.

3. The sensor chip package of claim 1, wherein the thin wire is a wire-bonding.

4. The sensor chip package of claim 2, wherein the thermistor chip is attached to at least the first conductive lead frame by a conductive adhesive.

5. The sensor chip package of claim 1, wherein the physical quantity sensor element is a flow rate sensor chip.

6. The sensor chip package of claim 5, wherein the outer leads include at least one exposed outer lead.

7. The sensor chip package of claim 6, wherein the flow rate sensor chip is sealed by the thermosetting resin so that the detection part of the sensor chip is exposed.

8. The sensor chip package of claim 7, wherein the second conductive lead flame is electrically connected with the circuit chip by a second thin wire and the second thin wire is also sealed by the thermosetting resin.

* * * * *